United States Patent
Lee et al.

(10) Patent No.: US 10,454,071 B2
(45) Date of Patent: Oct. 22, 2019

(54) LIGHT EXTRACTION SUBSTRATE FOR ORGANIC LIGHT EMITTING ELEMENT, METHOD FOR MANUFACTURING SAME, AND ORGANIC LIGHT EMITTING ELEMENT COMPRISING SAME

(71) Applicant: Corning Precision Materials Co., Ltd., Chungcheongnam-do (KR)

(72) Inventors: Hyun Hee Lee, Chungcheongnam-do (KR); Hong Yoon, Chungcheongnam-do (KR); Seo Hyun Kim, Chungcheongnam-do (KR); Kyoung Wook Park, Chungcheongnam-do (KR); Jeong Woo Park, Chungcheongnam-do (KR); June Hyong Park, Chungcheongnam-do (KR); Il Hee Baek, Chungcheongnam-do (KR); Gun Sang Yoon, Chungcheongnam-do (KR); Joo Young Lee, Chungcheongnam-do (KR); Eun Ho Choi, Chungcheongnam-do (KR)

(73) Assignee: Corning Precision Materials Co., Ltd. (KR)

( * ) Notice: Subject to any disclaimer, the term of this patent is extended or adjusted under 35 U.S.C. 154(b) by 538 days.

(21) Appl. No.: 15/036,698

(22) PCT Filed: Nov. 12, 2014

(86) PCT No.: PCT/KR2014/010867
§ 371 (c)(1),
(2) Date: May 13, 2016

(87) PCT Pub. No.: WO2015/072751
PCT Pub. Date: May 21, 2015

(65) Prior Publication Data
US 2016/0329525 A1     Nov. 10, 2016

(30) Foreign Application Priority Data

Nov. 13, 2013 (KR) .................. 10-2013-0137760

(51) Int. Cl.
H01L 51/52      (2006.01)
G02B 5/02       (2006.01)
H01L 51/56      (2006.01)

(52) U.S. Cl.
CPC ........ H01L 51/5268 (2013.01); G02B 5/0247 (2013.01); G02B 5/0278 (2013.01); H01L 51/56 (2013.01)

(58) Field of Classification Search
CPC ...... G02B 5/02; G02B 5/0205; G02B 5/0236; G02B 5/0247
(Continued)

(56) References Cited

U.S. PATENT DOCUMENTS

2010/0032701 A1   2/2010   Fudeta
2013/0114269 A1   5/2013   Domercq et al.
(Continued)

FOREIGN PATENT DOCUMENTS

JP   2010040761 A   2/2010
JP   2013539158 A   10/2013
(Continued)

OTHER PUBLICATIONS

Chien et. al., Microscostructure and optical properties of Ga-doped ZnO semiconductor thin films prepared by sol-gel process, thin solid films 519, 1516-1520.*
(Continued)

*Primary Examiner* — Robert E. Tallman
(74) *Attorney, Agent, or Firm* — Lerner, David, Littenberg, Krumholz & Mentlik, LLP

(57) ABSTRACT

The present invention relates to a light extraction substrate for an organic light emitting element, a method for manu-
(Continued)

facturing the same, and an organic light emitting element comprising the same and, more particularly, to a light extraction substrate for an organic light emitting element exhibiting a good light extraction efficiency, a method for manufacturing the same, and an organic light emitting element comprising the same. To this end, the present invention provides a light extraction substrate for an organic light emitting element, a method for manufacturing the same, and an organic light emitting element comprising the same, the light extraction substrate comprising a first light extraction layer having a plurality of pores formed therein and made of a first metal oxide doped with a dopant; and a second light extraction layer formed on the first light extraction layer and made of a second metal oxide which has a different atomic diffusion rate compared to the first metal oxide.

15 Claims, 3 Drawing Sheets

(58) Field of Classification Search
USPC .......................................... 359/359
See application file for complete search history.

(56) References Cited

U.S. PATENT DOCUMENTS

| 2013/0181602 A1* | 7/2013 | Kang | ................ H01L 51/5256 313/504 |
| 2013/0193416 A1 | 8/2013 | Shin | |
| 2014/0042422 A1* | 2/2014 | Silverman | ........... H01L 51/5268 257/40 |

FOREIGN PATENT DOCUMENTS

| KR | 20090085877 A | 8/2009 |
| KR | 20120053318 A | 5/2012 |

OTHER PUBLICATIONS

Young et. al., Electrical and optical properties of Al-doped ZnO thin films by sol-gel process, applied surface science 253, 4911-4916.*
International Search Report for Application No. PCT/KR2014/010867 dated Mar. 12, 2015.

* cited by examiner

LIGHT EXTRACTION SUBSTRATE FOR ORGANIC LIGHT EMITTING ELEMENT, METHOD FOR MANUFACTURING SAME, AND ORGANIC LIGHT EMITTING ELEMENT COMPRISING SAME

CROSS-REFERENCE TO RELATED APPLICATION

This application is a national phase entry under 35 U.S.C. § 371 of International Application No. PCT/KR2014/010867, filed Nov. 12, 2014, published in Korean, which claims priority to Korean Patent Application No. 10-2013-0137760, filed on Nov. 13, 2013, the disclosures of which are incorporated herein by reference.

TECHNICAL FIELD

The present invention relates to a light extraction substrate for an organic light-emitting device (OLED), a method of fabricating the same, and an OLED including the same. More particularly, the present invention relates to a light extraction substrate for an OLED having superior light extraction efficiency, a method of fabricating the same, and an OLED including the same.

BACKGROUND ART

Light-emitting devices may be generally divided into organic light-emitting devices (OLEDs) in which a light-emitting layer is formed of an organic material and inorganic light-emitting devices in which a light-emitting layer is formed of an inorganic material. OLEDs are self-emitting light sources based on the radiative decay of excitons in an organic light-emitting layer, the excitons being generated by the recombination of electrons injected through an electron injection electrode (cathode) and holes injected through a hole injection electrode (anode). OLEDs have a range of merits, such as low-voltage driving, self-emission, a wide viewing angle, high resolution, natural color reproducibility, and rapid response rates.

Recently, research into applying OLEDs to a variety of devices, such as portable communications devices, cameras, watches, office equipment, vehicle information display devices, televisions (TVs), display devices, illumination systems, and the like, has been actively undertaken.

In order to improve the luminous efficiency of OLEDs, it is necessary to improve the luminous efficiency of a material that constitutes a light-emitting layer or to improve light extraction efficiency in terms of a level at which light generated by the light-emitting layer is extracted.

Here, light extraction efficiency depends on the refractive indices of the layers of materials that constitute an OLED. In a typical OLED, when a beam of light generated by the light-emitting layer is emitted at an angle greater than a critical angle, the beam of light may be totally reflected at the interface between a higher-refractivity layer, such as a transparent electrode layer, and a lower-refractivity layer, such as a glass substrate. This consequently lowers light extraction efficiency, thereby lowering the overall luminous efficiency of the OLED, which is problematic.

More specifically, only about 20% of light generated by an OLED is emitted out and about 80% of the light generated is lost due to a waveguide effect originating from the difference in refractive indices between a glass substrate and an organic light-emitting layer that includes an anode, a hole injection layer, a hole transport layer, an emissive layer, an electron transport layer, and an electron injection layer, as well as by the total internal reflection originating from the difference in refractive indices between the glass substrate and ambient air. Here, the refractive index of the internal organic light-emitting layer ranges from 1.7 to 1.8, whereas the refractive index of indium tin oxide (ITO), generally used for the anode, is about 1.9. Since the two layers have a significantly low thickness, ranging from 200 nm to 400 nm, and the refractive index of the glass used for the glass substrate is about 1.5, a planar waveguide is thereby formed inside the OLED. It is estimated that the percentage of light lost in the internal waveguide mode due to the above-described reason is about 45%. In addition, since the refractive index of the glass substrate is about 1.5 and the refractive index of the ambient air is 1.0, when light exits the interior of the glass substrate, a beam of the light having an angle of incidence greater than a critical angle is totally reflected and trapped inside the glass substrate. The ratio of the trapped light is commonly about 35%, and only about 20% of generated light is emitted out.

Therefore, research into methods for improving the light extraction efficiency of OLEDs is being actively undertaken.

RELATED ART DOCUMENT

Patent Document 1: United States Patent Application Publication No. 2013-0193416 (Aug. 1, 2013)

DISCLOSURE

Technical Problem

Accordingly, the present invention has been made in consideration of the above problems occurring in the related art, and the present invention proposes an organic light-emitting device (OLED) having superior light extraction efficiency, a method of fabricating the same, and an OLED including the same.

Technical Solution

According to an aspect of the present invention, a light extraction substrate for an OLED may include: a first light extraction layer having a plurality of voids formed therein, the first light extraction layer including a first metal oxide and a dopant added thereto; and a second light extraction layer disposed on the first light extraction layer, the second light extraction layer including a second metal oxide having a different diffusion rate of atoms from the first metal oxide.

The diffusion rate of atoms of the first metal oxide may be faster than the diffusion rate of atoms of the second metal oxide.

The refractive index of the first metal oxide may be greater than the refractive index of the second metal oxide.

The first metal oxide may be ZnO, and the second metal oxide may be $Al_2O_3$.

Here, the dopant may be Ga.

The content of the dopant may range, by weight, 4.1% to 11.3% of the amount of the first metal oxide.

The plurality of voids may be formed in the inward direction of the first light extraction layer from a boundary between the first light extraction layer and the second light extraction layer.

The light extraction substrate may further include a planarization layer disposed on the second light extraction layer.

According to another aspect of the present invention, a method of fabricating a light extraction substrate for an OLED may include: a first light extraction layer forming operation of forming a first light extraction layer including a first metal oxide and a dopant added thereto; a second light extraction layer forming operation of forming a second light extraction layer including a second metal oxide, a diffusion rate of atoms of which is slower than a diffusion rate of atoms of the first metal oxide; and a void forming operation of forming a plurality of voids within the first light extraction layer through diffusing atoms by heat-treating the first light extraction layer and the second light extraction layer.

Here, Ga may be used as a dopant in the first light extraction layer forming operation.

The first light extraction layer forming operation may include doping the first metal oxide with the Ga with a content ranging, by weight, 4.1% to 11.3% of an amount of the first metal oxide.

The first light extraction layer forming operation may include depositing ZnO on a substrate by atmospheric pressure chemical vapor deposition.

The second light extraction layer forming operation may include depositing $Al_2O_3$ on the first light extraction layer by electron beam processing or sputtering.

The void forming operation may include heat-treating the first light extraction layer and the second light extraction layer in a temperature ranging from 600° C. to 800° C.

According to a further aspect of the present invention, an OLED may include the above-described light extraction substrate for an OLED on a path on which light generated thereby is emitted out.

Advantageous Effects

As set forth above, metal oxide thin films having different thermal diffusion rates of atoms can be laminated and heat-treated, thereby forming a variety of light-scattering voids in the metal oxide thin film having a faster diffusion rate of atoms.

In addition, it is possible to control positions in which voids are formed and the concentration of voids by adjusting the content of a dopant added to the metal oxide thin film having a faster diffusion rate of atoms.

Furthermore, when the metal oxide thin film having a plurality of voids formed therein is applied as a light extraction layer of an OLED, the metal oxide thin film can improve the light extraction efficiency of the OLED. It is thereby possible to drive the OLED at a low voltage, thereby reducing the power consumption of a lighting device or a display device using the OLED and improving the luminance thereof.

BEST MODE

Hereinafter, a light extraction substrate for an organic light-emitting device (OLED), a method of fabricating the same, and an OLED including the same according to an exemplary embodiment of the present invention will be described in detail with reference to the accompanying drawing.

In addition, in the description of the present invention, detailed descriptions of known functions and components will be omitted in the case that the subject matter of the present invention is rendered unclear by the inclusion thereof.

Figure 1:
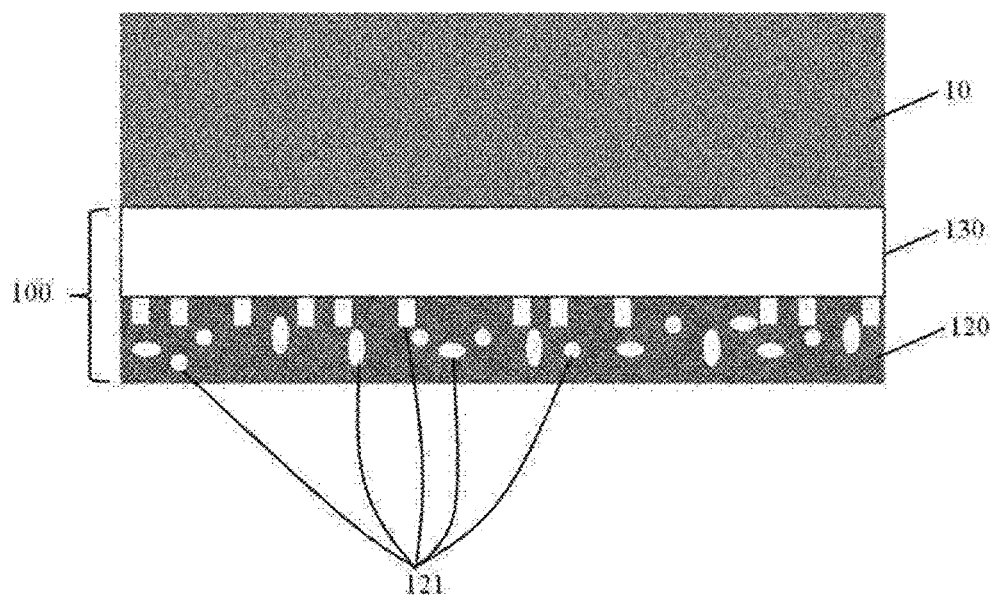
FIG. 1 is a cross-sectional view schematically illustrating a light extraction substrate for an OLED and an OLED including the same according to an exemplary embodiment of the present invention.

As illustrated in FIG. 1, a light extraction substrate 100 for an OLED according to an exemplary embodiment of the present invention is a substrate disposed on a path on which light generated by an OLED 10 is emitted out in order to improve the light extraction efficiency of the OLED 10 that has only been allowing about 20% of light to be emitted out.

Although not specifically illustrated, the OLED 10 has a multilayer structure in which an anode, an organic light-emitting layer, and a cathode are sandwiched between a pair of opposite substrates that face each other. In this case, the anode may be formed of a metal, such as Au, In, or Sn, or a metal oxide, such as an indium tin oxide (ITO), that has a greater work function in order to facilitate hole injection. In addition, the cathode may be a metal thin film formed of Al, Al:Li or Mg:Ag that has a lower work function in order to facilitate electron injection. When the OLED 10 is a top-emission OLED, the light extraction substrate 100 according to the embodiment of the present invention is disposed on the cathode. In this case, the cathode may have a multilayer structure including a semitransparent electrode thin film formed of a metal, such as Al, Al:Li, or Mg:Ag, and a transparent electrode thin film formed of an oxide, such as ITO, in order to facilitate the transmission of light generated by the organic light-emitting layer. The organic light-emitting layer may include a hole injection layer, a hole transport layer, an emissive layer, an electron transport layer, and an electron injection layer, sequentially stacked on the anode. When the OLED 10 is a white OLED applied to a lighting system, the light-emitting layer may have, for example, a multilayer structure including a high-molecular light-emitting layer that emits blue light and a low-molecular light-emitting layer that emits orange-red light, as well as a variety of other structures, to emit white light. In addition, the OLED may have a tandem structure including a plurality of organic light-emitting layers alternating with interconnecting layers.

With this structure, when a forward voltage is induced between the anode and the cathode, electrons from the cathode migrate to the emissive layer through the electron injection layer and the electron transport layer, and holes from the anode migrate to the emissive layer through the hole injection layer and the hole transport layer. The electrons and the holes that have migrated into the emissive layer recombine with each other, thereby generating excitons. When excitons transit from an excited state to a ground state, light is emitted. The brightness of emitted light is proportional to the amount of current that flows between the anode and the cathode.

The light extraction substrate 100 employed in the OLED 10 as described above includes a first light extraction layer 120 and a second light extraction layer 130.

The first light extraction layer 120 may be formed between a substrate situated on a path on which light is emitted out and the anode. The first light extraction layer 120 includes a metal oxide to which a dopant is added. The dopant may be gallium (Ga). In addition, a number of voids 121 are formed within the first light extraction layer 120. The voids 121 act to scatter light emitted from the OLED 10, more particularly, to complexify or diversify paths on which light generated by the OLED 10 is emitted, thereby improving light extraction efficiency in the forward direction. The number of voids 121 may have the same or a variety of different shapes or sizes. That is, the number of voids 121 may have random sizes, distances, shapes, or forms. The number of randomly-formed voids 121 can promote light extraction over a wide range of wavelengths rather than a specific range of wavelengths, so the OLED 10 including the light extraction substrate 100 according to the embodiment of the present invention can be more useful when the OLED 10 is applied to a lighting system.

Here, the number of voids 121 are formed within the first light extraction layer 120 by the Kirkendall effect occurring from a multilayer structure of two materials having different thermal diffusion rates of atoms, in which atoms of a material having a faster diffusion rate of atoms migrate to a material having a slower diffusion rate of atoms. In this regard, the metal oxide of the first light extraction layer 120 is selected to be a material, the diffusion rate of atoms of which is different from, and more particularly, faster than, the diffusion rate of atoms of the metal oxide of the second light extraction layer 130. In addition, the metal oxide of the first light extraction layer 120 may be selected to be a material, the refractive index of which is greater than the refractive index of the metal oxide of the second light extraction layer 130. For example, the metal oxide of the first light extraction layer 120 may be ZnO, while the metal oxide of the second light extraction layer 130 may be $Al_2O_3$.

The level of distribution of the number of voids 121 is controlled depending on the concentration of a dopant added to the metal oxide of the first light extraction layer 120. According to the embodiment of the present invention, the dopant added to the metal oxide of the first light extraction layer 120 may range, by weight, from 4.1% to 11.3% of the amount of the metal oxide, i.e. ZnO. When the concentration of the dopant is in a lower level of this range, the number of voids 121 are mainly formed in the inward direction of the first light extraction layer 120 from the boundary between the first light extraction layer 120 and the second light extraction layer 13. When concentration of the dopant is in a higher level of this range, the number of voids 121 are uniformly formed not only in the boundary between the first light extraction layer 120 and the second light extraction layer 130 but also in the entirety of the inner area of the first light extraction layer 120.

The second light extraction layer 130 is formed on the first light extraction layer 120. As described above, the second light extraction layer 130 may include a metal oxide, for example, $Al_2O_3$, the diffusion rate of atoms of which is slower than the diffusion rate of atoms of the metal oxide of the first light extraction layer 120, such that the number of voids 121 are formed within the first light extraction layer 120 through atom diffusion during the fabrication process. The second light extraction layer 130 works in concert with the first light extraction layer 120 as the internal light extraction layer of the OLED 10. Here, the second light extraction layer 130 abuts the anode of the OLED 10. When the level of flatness of the surface of the second light extraction layer 130 abutting anode is low, the surface shape of the second light extraction layer 130 may be transferred to the anode, thereby lowering the electrical properties of the OLED 10. In order to prevent this problem, a planarization layer (not shown) may be formed between the second light extraction layer 130 and the anode when the light extraction substrate 100 according to the embodiment of the present invention is applied to the OLED 10.

When the light extraction substrate 100 according to the embodiment of the present invention including the first light extraction layer 120 having the number of voids 121 formed therein and the second light extraction layer 130 is applied to the OLED 10, the light extraction efficiency of the OLED 10 can be improved. It is thereby possible to drive the OLED 10 at low current, thereby reducing the power consumption of a lighting system or a display device employing the OLED as a light source while improving the luminance of the lighting system or the display device.

Hereinafter, a method of fabricating a light extraction substrate for an OLED according to an embodiment of the present invention will be described with reference to FIG. 2. FIG. 1 will also be referred to for the specific components thereof.

Figure 2:
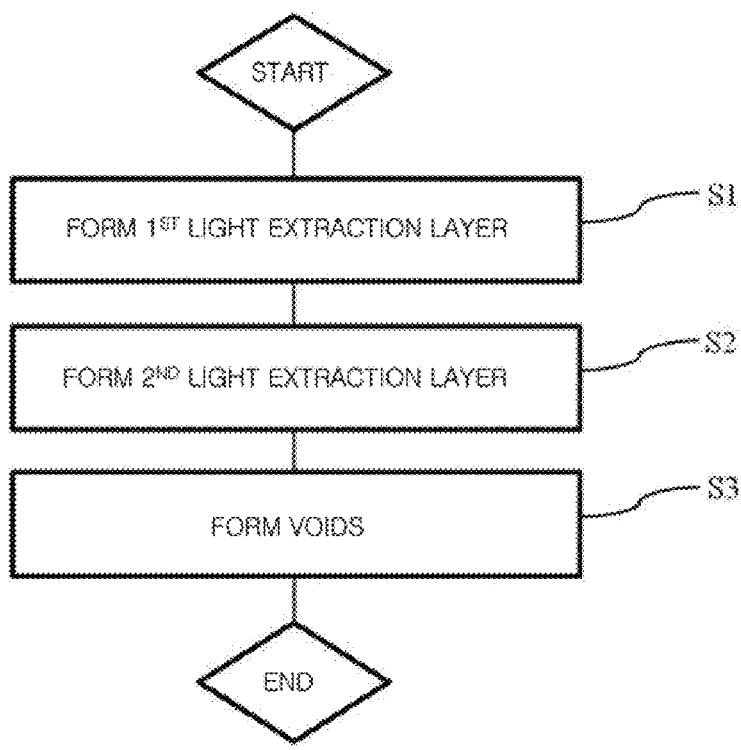
FIG. 2 is a flowchart illustrating a method of fabricating a light extraction substrate for an OLED according to an exemplary embodiment of the present invention.

FIG. 2 is a flowchart illustrating the method of fabricating a light extraction substrate for an OLED according to the embodiment of the present invention.

As illustrated in FIG. 2, the method of fabricating a light extraction substrate for an OLED according to the exemplary embodiment of the present invention is a method of fabricating the light extraction substrate 100 disposed on a path on which light generated by the OLED 10 is emitted out in order to improve the light extraction efficiency of the OLED 10. The method of fabricating a light extraction substrate for an OLED includes a first light extraction layer forming operation S1, a second light extraction layer forming operation S2, and a void forming operation S3.

First, the first light extraction layer forming operation S1 is an operation of forming the first light extraction layer 120 from a metal oxide with a dopant being added thereto. In the first light extraction layer forming operation S1, ZnO, a metal oxide, is deposited on one of a pair of encapsulation substrates of the OLED 10 by atmospheric pressure chemical vapor deposition (APCVD). In addition, in the first light extraction layer forming operation S1, Ga is added to ZnO as a dopant. In the first light extraction layer forming operation S1, the doping content of Ga may range, by weight, from 4.1% to 11.3% of the amount of ZnO. The Ga doping may be performed during APCVD or after the deposition of the ZnO thin film.

Afterwards, the second light extraction layer forming operation S2 may be an operation of forming the second light extraction layer 130 on the first light extraction layer 120, the second light extraction layer 130 including a metal oxide different from the metal oxide of the first light extraction layer 120. In the second light extraction layer forming operation S2, a metal oxide, for example, $Al_2O_3$, the diffusion rate of atoms of which is slower than the diffusion rate of atoms of the metal oxide of the first light extraction layer 120, is deposited on the first light extraction layer 120 using by electron (E)-beam processing or sputtering, such that the number of voids 121 can be formed within the first light extraction layer 120 through the Kirkendall effect based on the diffusion of atoms during heat treatment in the subsequent process.

Finally, the void forming operation S3 is an operation of forming the number of voids 121 within the first light extraction layer 120 through diffusing atoms. Specifically, in the void forming operation S3, the first light extraction layer 120 and the second light extraction layer 130 stacked on each other in one direction are heat-treated. In the void forming operation S3, the heat treatment may be performed at a temperature ranging from 600° C. to 800° C. When the temperature of the heat treatment is below 600° C., the heat treatment fails to form the voids 121. When the temperature of the heat treatment exceeds 800° C., it is difficult to control the number of voids 121 to have intended shapes. In addition, in order to produce the number of voids 121 at sufficient sizes, the heat treatment must be performed for at least one hour. When the heat treatment time exceeds five hours, diffusion atoms are saturated, and no more atoms may diffuse. A heat treatment performed for longer than five hours is thus of no use, since the voids 121 are no longer formed when the heat treatment time exceeds five hours.

When the first light extraction layer 120 and the second light extraction layer 130 are heat-treated as described above, the number of voids 121 are formed in the boundary between the first light extraction layer 120 and the second light extraction layer 130 and within the first light extraction layer 120 including the metal oxide having a faster diffusion rate of atoms. The closer to 800° C. the heat treatment temperature is, the more and greater the voids 121 are formed. In addition, the higher the concentration of Ga added to the metal oxide, ZnO, is, the more uniformly the number of voids 121 are formed in the entire interior of the first light extraction layer 120. When the concentration of doped Ga is low, the number of voids 121 are mainly formed in the boundary between the first light extraction layer 120 and the second light extraction layer 130. That is, the position, size, and number of the voids 121 formed within the first light extraction layer 120 are controlled through controlling the doping concentration of Ga in the first light extraction layer forming operation and through controlling the temperature of the heat treatment in the void forming operation S3.

When the void forming operation S3 is completed, the light extraction substrate 100 for an OLED according to the embodiment of the present invention is fabricated.

Example 1: Difference in Formation of Voids Depending on Heat Treatment Temperatures Three samples were fabricated by depositing Ga-doped ZnO thin films at a thickness of about 500 nm on substrates by APCVD and then depositing $Al_2O_3$ thin films at a thickness of 200 nm on the ZnO thin films by e-beam processing or sputtering. Here, Sample 1 (RT) was not heat-treated, Sample 2 (700° C.) was heat-treated at 700° C. for five hours, and Sample 3 (800° C.) was heat-treated at 800° C. for five hours. In addition, Sample 4 (ZnO 800° C.) was fabricated by depositing a ZnO thin film to a thickness of about 500 nm on a substrate by APCVD and then depositing an $Al_2O_3$ thin film on the ZnO thin film by e-beam processing or sputtering. Thereafter, Sample 4 was heat-treated at 800° C. for five hours.

Figure 3:
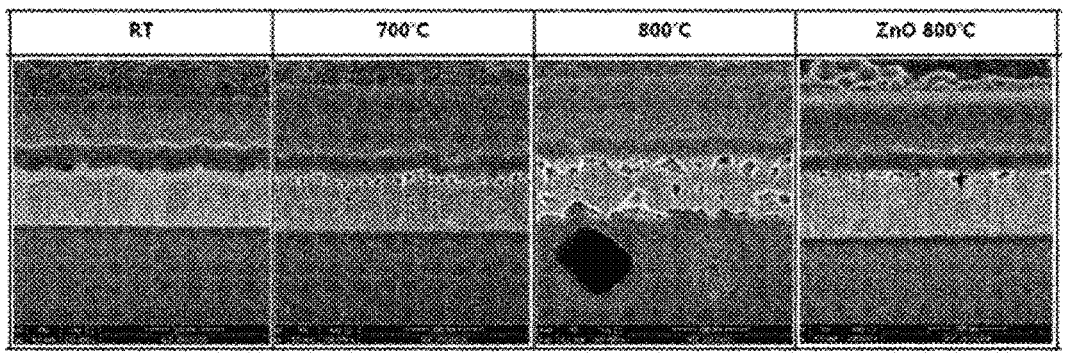
FIG. 3 illustrates FIB-SEM analysis results taken from examples of the present invention, representing differences in the formation of voids depending on heat treatment temperatures.

As illustrated in FIG. 3, the effects of the formation of voids on the four samples fabricated as above were analyzed by examining the cross-sections thereof using FIB-SEM. Referring to FIG. 3, no voids were found in Sample 1 (RT) that was not heat-treated. Among the heat-treated samples, Sample 3 (800° C.) was found to have more and greater voids. In addition, In the case of Sample 4 (ZnO 800° C.) having no Ga added thereto, less and smaller voids were found only in regions close to the boundary between the ZnO thin film and the $Al_2O_3$ thin film. In addition, when Ga-doped Sample 2 (700° C.) is compared with Sample 4 (ZnO 800° C.) having no Ga added thereto, Sample 2 (700° C.) heat-treated at a lower temperature was found to have more voids distributed in the entire ZnO thin film. That is, it is appreciated that more voids were formed in wider regions of the Ga-doped sample than the sample having no Ga added thereto, even if the Ga-doped sample was heat-treated at a lower temperature.

Figure 4:
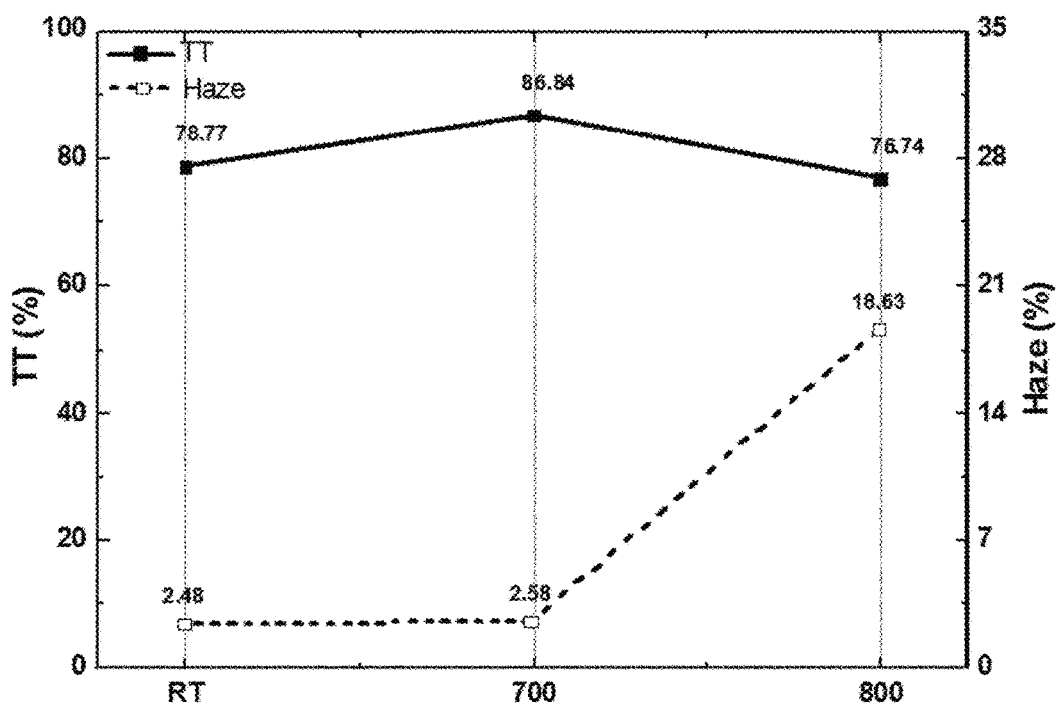
FIG. 4 illustrates transmittance and haze measurement results taken from examples of the present invention.

In order to examine the scattering effect of voids, the transmittance and the degree of haze of Sample 1 to Sample 3 were measured, and the measured results were marked on a graph in FIG. 4. Referring to the graph in FIG. 4, the degree of haze of Sample 1 (RT) without heat treatment was measured to be 2.48%, and the level of haze of Sample 2 (700° C.) was measured to be 2.58%. In particular, the level of haze of Sample 3 (800° C.) was measured to be 18.63%, which is about 7.5 times the level of haze of Sample 1 (RT) without heat treatment. This indicates that the voids were formed by an increased number corresponding thereto.

Example 2: Difference in Formation of Voids Depending on Ga Concentrations

Five samples were fabricated by depositing Ga-doped ZnO thin films at a thickness of about 500 nm on substrates by APCVD and then depositing $Al_2O_3$ thin films at a thickness of about 200 nm on the ZnO thin films by e-beam processing or sputtering. Here, the concentrations of doped Ga with respect to the amount of ZnO were controlled to be, by weight, 4.1% for Sample 1, 6.2% for Sample 2, 7.8% for Sample 3, 8.8% for Sample 4, and 11.3% for Sample 5. Thereafter, Sample 1 to Sample 5 having different Ga concentrations as described above were heat-treated at 800° C. for five hours.

Figure 5:
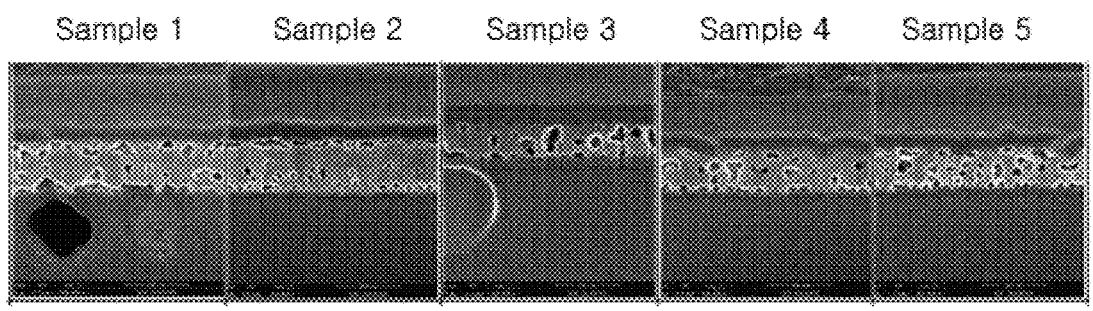
FIG. 5 illustrates FIB-SEM analysis results taken from examples of the present invention, representing differences in the formation of voids depending on Ga concentrations.

As illustrated in FIG. 5, the effects of the formation of voids on the five samples fabricated as above were analyzed by examining the cross-sections thereof using FIB-SEM. Referring to FIG. 5, in Sample 5 having the highest concentration of doped Ga, voids were found to be uniformly distributed in the entire area of the ZnO thin film. In addition, the higher the concentration of doped Ga was, the more uniformly the voids were found in the inner area of the ZnO thin film. In contrast, when the concentration of doped Ga was low, the voids were mainly found in the boundary between the ZnO thin film and the $Al_2O_3$ thin film.

The foregoing descriptions of specific exemplary embodiments of the present invention have been presented with respect to the drawings. They are not intended to be exhaustive or to limit the present invention to the precise forms disclosed herein, and many modifications and variations are obviously possible for a person having ordinary skill in the art in light of the above teachings.

It is intended therefore that the scope of the present invention should not be limited to the foregoing embodiments, but shall be defined by the Claims appended hereto and their equivalents.

The invention claimed is:

1. A light extraction substrate for an organic light-emitting device, comprising:
    a first light extraction layer having a plurality of voids formed therein, the first light extraction layer comprising a first metal oxide and a dopant added to the first metal oxide; and a second light extraction layer disposed on the first light extraction layer, the second light extraction layer comprising a second metal oxide having a different diffusion rate of atoms from the first metal oxide, wherein the diffusion rate of atoms of the first metal oxide is faster than the diffusion rate of atoms of the second metal oxide, and wherein the second light extraction layer is positioned between the first light extraction layer and the organic light-emitting device.

2. The light extraction substrate according to claim 1, wherein a refractive index of the first metal oxide is greater than a refractive index of the second metal oxide.

3. The light extraction substrate according to claim 1, wherein the first metal oxide is ZnO, and the second metal oxide is $Al_2O_3$.

4. The light extraction substrate according to claim 3, wherein the dopant is Ga.

5. The light extraction substrate according to claim 4, wherein a content of the dopant ranges, by weight, from 4.1% to 11.3% of an amount of the first metal oxide.

6. The light extraction substrate according to claim 1, wherein the plurality of voids are formed in an inward direction of the first light extraction layer from a boundary between the first light extraction layer and the second light extraction layer.

7. The light extraction substrate according to claim 1, further comprising a planarization layer disposed on the second light extraction layer.

8. A method of fabricating a light extraction substrate for an organic light-emitting device, comprising:

a first light extraction layer forming operation of forming a first light extraction layer, the first light extraction layer comprising a first metal oxide and a dopant added to the first metal oxide;

a second light extraction layer forming operation of forming a second light extraction layer, the second light extraction layer comprising a second metal oxide, a diffusion rate of atoms of which is slower than a diffusion rate of atoms of the first metal oxide, wherein the second light extraction layer is positioned between the first light extraction layer and the organic light-emitting device; and a void forming operation of forming a plurality of voids within the first light extraction layer through diffusing atoms by heat-treating the first light extraction layer and the second light extraction layer.

9. The method according to claim 8, wherein Ga is used as the dopant in the first light extraction layer forming operation.

10. The method according to claim 9, wherein the first light extraction layer forming operation comprises doping the first metal oxide with the Ga with a content ranging, by weight, 4.1% to 11.3% of an amount of the first metal oxide.

11. The method according to claim 10, wherein the first light extraction layer forming operation comprises depositing ZnO on a substrate by atmospheric pressure chemical vapor deposition.

12. The method according to claim 11, wherein the second light extraction layer forming operation comprises depositing $Al_2O_3$ on the first light extraction layer by electron beam processing or sputtering.

13. The method according to claim 8, wherein the void forming operation comprises heat-treating the first light extraction layer and the second light extraction layer in a temperature ranging from 600° C. to 800° C.

14. A light-emitting device comprising the light extraction substrate for an organic light-emitting device as claimed in claim 1 on a path on which light generated thereby is emitted out.

15. A light extraction substrate for an organic light-emitting device, comprising:

a first light extraction layer having a plurality of voids formed therein, the first light extraction layer comprising a first metal oxide and a dopant added to the first metal oxide; and a second, non-porous light extraction layer disposed on the first light extraction layer, the second light extraction layer comprising a second metal oxide having a different diffusion rate of atoms from the first metal oxide, wherein the diffusion rate of atoms of the first metal oxide is faster than the diffusion rate of atoms of the second metal oxide, and wherein the second light extraction layer is positioned between the first light extraction layer and the organic light-emitting device.

* * * * *